Sept. 19, 1961 R. W. BRADMILLER 3,001,145

MULTISTAGE TRANSISTOR AMPLIFIER

Filed Nov. 28, 1956

INVENTOR.

RICHARD W. BRADMILLER

BY Alden D. Redfield

Irwin P. Garfinkle

ATTORNEYS.

United States Patent Office 3,001,145

Patented Sept. 19, 1961

3,001,145

MULTISTAGE TRANSISTOR AMPLIFIER

Richard W. Bradmiller, Cincinnati, Ohio, assignor to Avco Manufacturing Corporation, Cincinnati, Ohio, a corporation of Delaware Filed Nov. 28, 1956, Ser. No. 624,892

1 Claim. (Cl. 330—19)

Figure 1:
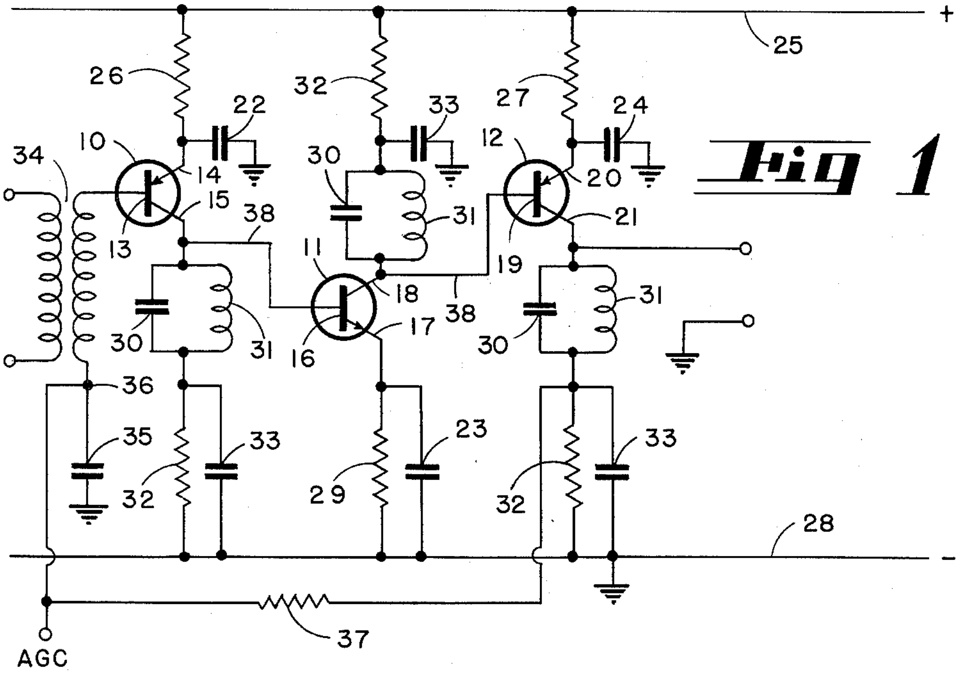

This invention relates in general to signal amplifying circuits, and more particularly to multiple stage amplifiers using transistors and having features of negative D.C. feedback and automatic gain control.

A problem in the use of transistor amplifiers has been the achievement of stable and consistent operation for conditions of changing bias that are encountered as a result of transistor parameter variation, temperature change or applied gain control. Another problem has been the tendency of transistor amplifiers to oscillate as a result of regeneration through the inherent internal capacity of the transistors. Because of this tendency, neutralization has been required.

By means of this invention there has been provided simple, economical and practical circuitry for producing stable operating conditions over a wide temperature range, or under conditions of changing internal transistor parameters; for providing automatic gain control; and for eliminating the requirement for neutralization. This invention has found practical utility in intermediate frequency amplifiers used in superheterodyne receivers.

It is therefore an object of this invention to provide a transistor amplifier circuit capable of stable and consistent operation with wide tolerance active and passive elements.

Another object of this invention is to provide stable and consistent amplifier operation for conditions of changing bias that are encountered due to transistor parameter variation, temperature change or applied gain control.

A further object of this invention is the use of a minimum number of wide tolerance, low cost passive circuit elements for greatest economy in space, in assembly and alignment, in power consumption, and in permitting satisfactory operation as described above with the use of commercially available transistors.

A still further object of this invention is the provision of a multiple stage transistor amplifier circuit in which automatic gain control is achieved in all stages by the application of a control signal at a control point in only one stage of the amplifier.

Figure 2:
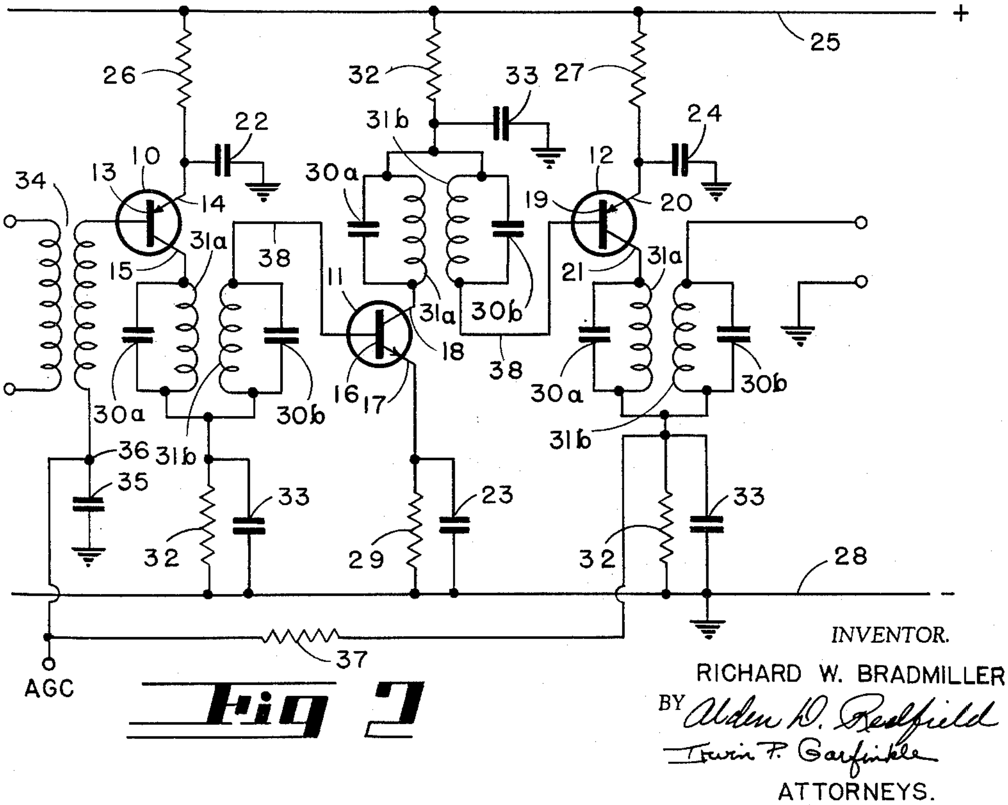

For an understanding of the invention, reference should now be made to the drawing in which:

FIGURE 1 is a simplified schematic drawing of a narrow band high frequency amplifier of the semi-fixed tuned type such as is commonly used for the intermediate frequency amplifier in a superheterodyne receiver, and FIGURE 2 is a circuit similar to FIGURE 1, but employing a double tuned interstage coupling A.C. collector circuit.

The embodiment shown in FIGURE 1 is a 3-stage amplifier system using three cascaded transistor amplifier stages 10, 11 and 12. Although three stages are illustrated, it is to be understood that this invention is equally applicable and will operate successfully for many purposes with two or more stages.

The first transistor amplifier stage 10 comprises a PNP type transistor having a base 13, an emitter 14, and a collector 15. The second stage 11 comprises an NPN type transistor having a base 16, an emitter 17, and a collector 18. The third stage 12 is identical to the first and comprises a transistor having a base 19, an emitter 20, and a collector 21. In the preferred embodiment, each transistor is connected common emitter for both A.C. and D.C. operation, the emitters 14, 17 and 20 being connected to ground through condensers 22, 23 and 24, respectively. It is to be understood, that with appropriate alterations in the circuitry, the invention is also applicable with transistors which are connected common base and common collector. The PNP type transistors 10 and 12 are supplied with positive bias from a suitable D.C. source from the positive line 25 through the emitter resistors 26 and 27. The emitter of the NPN transistor 11 is supplied with negative bias from the grounded negative line 28 through the emitter resistor 29.

The collector of each transistor is provided with both A.C. and D.C. load circuits. Since the circuit shown is designed for use as an intermediate frequency amplifier in a superheterodyne receiver, the A.C. load circuit in each stage comprises a fixed frequency parallel resonant circuit comprises a condenser 30 and an inductor 31. The resistors 32 in each collector circuit comprise the D.C. collector loads, while the condensers 33 provide an A.C. by-pass across the load resistors to ground.

The input signal to the amplifier is applied at the base 13 of the first stage 10 through the transformer 34, the secondary of which is grounded through a condenser 35. The output signal is taken from the collector of the last stage, in this case, from the collector 21 of the transistor amplifier 12. Negative D.C. feedback is introduced at a control point 36 in the input transformer by means of a signal taken from the D.C. load resistor 32 in the collector circuit of the last stage and through a feedback resistor 37. It is to be understood that if only two stages are used, the negative feedback signal would be obtained from across the emitter resistor 29 in the second stage. In addition, an automatic gain control signal is applied from an appropriate A.G.C. point in the superheterodyne receiver (not shown) to the same control point 36 in the input circuit. The output of each transistor is coupled directly from the collector of the first stage to the base of the succeeding stages by means of leads 38.

The circuit as described offers many advantages. In conventional circuits neutralization is required to eliminate feedback through the internal capacity between the collector and base of the transistor. In this circuit, however, the A.C. load impedance is reduced by the direct coupling of the collector to the base, thereby producing a lower voltage gain. As a result, a reduced voltage is fed back by the transistor internal capacitances and neutralization is normally not required. In addition, since the transistor load is decreased, the L/C ratio of the tuned circuits 30, 31 may be much smaller than usually employed, and therefore, a smaller inductance and a much larger capacitance may be used for operation at the same resonant frequency. With a larger capacitance in the load circuit, the effect of the inherent internal capacity is minimized. This results in a circuit whose selectivity characteristics are essentially independent of transistor reactor variations. Moreover, the use of the D.C. load resistors 26, 29 and 27 in the emitter circuit degenerates the D.C. gain and, therefore, the D.C. characteristics of the transistors become dependent on the large external resistor values rather than the transistor internal parameters. Consequently, any commercially available transistor which is suitable for amplifying the desired frequency band may be used in the circuit.

More over, because of the alternate PNP–NPN arrangements, simplified and economical automatic gain control and negative D.C. feedback circuits are permitted. With the alternate arrangement, a single control voltage applied at the first stage can cause all collector currents to increase or decrease simultaneously. To illustrate, assume that at a given instant the sense of the signal at the base 13 of transistor 10 is positive. Then the sense of the signal at the emitter 14 is also positive, while the sense of the signal at the collector 15 and at the directly coupled base 16 of the following transistor 11 will be negative. Similarly, the emitter 17 will be negative, while the collector 18 will have a positive sense. Following through into the third stage, the base 19 and the emitter 20 are positive, while the collector phase is negative. Thus, if due to temperature variation or any other cause, an increase should occur in the output of the 3-stage amplifier circuit, a single D.C. negative feedback circuit to the input will cause a decrease in the output of each of the individual amplifiers 10, 11 and 12. This overall D.C. negative feedback provides excellent amplifier operation over wide temperature ranges and also serves to control th magnitude, amount and rate of gain control.

Similarly, a single automatic gain control signal applied at the control point 36 of the input circuit will simultaneously control the gain of each individual amplifier. Since amplifier A.C. and D.C. gain are separated, the system does not require the conventional A.G.C. control voltage—i.e., that which varies from 0 volts to some finite magnitude. According to this invention, the circuit can be adapted to gain control on any incremental voltage change merely by proper choice of the first stage emitter resistance 26, proper adjustment of the amount and source of bias current and appropriate selection of the first stage transistor. The first stage transistor may be either PNP or NPN and it is chosen so that the application of gain control voltage tends to decrease its current. The following stages will then operate as indicated.

Thus, the circuit described provides for both negative feedback and multiple stage gain control by the application of both signals at a single control point. This results in the improved operation and economy due to simplication of the circuitry and by elimination of power losses resulting from negative feedback neutralization and gain control formerly required at each of the several stages.

In FIGURE 1, it is seen that a direct path is used between the collector of each stage and the base of the succeeding stage. Selectively is derived in FIGURE 1 with the use of very low impedance single-tuned circuits 30, 31. However, where additional skirt selectivity is required, i.e., where it is desired to increase the steepness of the sides of the resonance curve double-tuned circuitry may be employed for interstage coupling. The simplest embodiment of this form of the invention is shown in FIGURE 2, which is identical to FIGURE 1 in every detail except that the double-tuned parallel resonant circuits 30*a*, 31*a* and 30*b*, 31*b* have been substituted for the single-tuned circuit 30, 31. The double-tuned circuit presents the same A.C. load impedance as found in the single-tuned circuit, and the D.C. resistance from collector to base remains substantially zero. The path of the collector current in FIGURE 2 is through each of the double-tuned coils 31*a* and 31*b* to a common A.C. ground, but since these coils present little or no D.C. impedance, D.C. performance is not altered in any way. In so far as D.C. currents are concerned, the collectors are effectively connected directly to the succeeding bases and hence, the circuit operation is identical to that previously described. To maintain interchangeability and stability with this circuitry, the tuned $L/C$ ratio and the inductive or capacitive coupling between the coils 31*a* and 31*b* are chosen to provide the same resonance load conditions as described for the single-tuned circuit.

The systems designed with approximately full supply voltage across the last transistor, and with a low impedance load provide greater power handling capabilities than that found in conventional transistor amplifiers.

This is quite desirable and gives an enhancement of detector and A.G.C. properties in transistor receivers.

In systems disclosed, small emitter and collector external resistances can be unbypassed, thus affording a savings of several capacitors. This will modify the impedances, depending upon the exact resistance value used, but the method of operation and over-all gain will remain essentially the same.

While there has been shown and described what is at present considered to be the preferred embodiment of the invention, it will be understood by those skilled in the art that various modifications and changes and substitutions of equivalents may be made therein within the true scope of the invention as defined by the appended claim.

Having fully disclosed and described my invention, I claim:

A multiple stage intermediate frequency signal amplifier circuit having an odd numbered plurality of stages; a transistor in each of said stages, each of the transistors having at least base, emitter, and collector electrodes, the successive stages being provided alternately with PNP and NPN transistors; means including a two-terminal source of potential for operatively biasing said transistors; each of said stages including a direct current emitter resistor load connected between said emitter electrode and one of said terminal; a capacitor connected across each emitter resistor load for by-passing said intermediate frequency signals; each of said stages also including an intermediate frequency signal load in series with a direct current collector load connected between said collector electrode and the other of said terminals, said intermediate frequency load comprising a capacitor and an inductor tuned to said intermediate frequency, said direct current load comprising a collector resistor and a capacitor connected across said collector resistor for by-passing said intermediate frequency signal from said collector resistor; means applying said signal between the base and emitter electrodes of the first stage transistor; means directly connecting the collector electrode of each transistor, except the last, to the base of a succeeding transistor; means deriving an amplified output signal from across the tuned intermediate frequency load of the last transistor; a direct current source of variable automatic gain control current coupled to the base electrode of the transistor in said first stage; and a direct current negative feedback means connected from a direct current collector load in the output circuit of the last stage to the base electrode of the transistor in said first stage, said direct current negative feedback means opposing said direct current source of variable automatic gain control solely with a direct current potential of bucking character.

References Cited in the file of this patent

UNITED STATES PATENTS

| | | |
|---|---|---|
| 2,762,873 | Goodrich | Sept. 11, 1956 |
| 2,762,875 | Fischer | Sept. 11, 1956 |
| 2,773,945 | Theriault | Dec. 11, 1956 |
| 2,789,164 | Stanley | Apr. 16, 1957 |

FOREIGN PATENTS

| | | |
|---|---|---|
| 201,034 | Australia | Feb. 22, 1956 |

OTHER REFERENCES

Lohman: "Complementary Symmetry," Electronics, Sept. 1953, pp. 140–143.

Stern et al.: "Transistor Broadcast Receivers," Electrical Engineering, pp.1107–1112, Dec. 1954.

Aronson et al.: "Electronic Circuitry," Instruments & Automation Sept. 1955, page 1526.

Chow and Stern: "Automatic Gain Control of Transistor Amplifiers," Proceedings of the IRE, September 1955, pages 1119–1127.